(12) United States Patent
Pritz et al.

(10) Patent No.: US 12,124,092 B2
(45) Date of Patent: Oct. 22, 2024

(54) CIRCUIT BOARD CONNECTOR FOR A CIRCUIT BOARD

(71) Applicant: MD Elektronik GmbH, Waldkraiburg (DE)

(72) Inventors: Helmut Pritz, Ampfing (DE); Thomas Halbig, Dietfurt (DE)

(73) Assignee: MD ELEKTRONIK GMBH, Waldkraiburg (DE)

( * ) Notice: Subject to any disclaimer, the term of this patent is extended or adjusted under 35 U.S.C. 154(b) by 109 days.

(21) Appl. No.: 18/045,177

(22) Filed: Oct. 10, 2022

(65) Prior Publication Data
US 2023/0118676 A1  Apr. 20, 2023

(30) Foreign Application Priority Data
Oct. 19, 2021 (DE) .......................... 102021127032.4

(51) Int. Cl.
*H04B 10/00* (2013.01)
*G02B 6/38* (2006.01)
*H01R 12/70* (2011.01)
*H05K 1/18* (2006.01)

(52) U.S. Cl.
CPC ....... *G02B 6/3897* (2013.01); *H01R 12/7023* (2013.01); *H05K 1/18* (2013.01); *H05K 2201/09063* (2013.01); *H05K 2201/09072* (2013.01); *H05K 2201/10121* (2013.01); *H05K 2201/10189* (2013.01)

(58) Field of Classification Search
CPC .... G02B 6/4292; G02B 6/322; G02B 6/4284; G02B 6/32; G02B 6/4214; G02B 6/4246; G02B 6/3897
See application file for complete search history.

(56) References Cited

U.S. PATENT DOCUMENTS

| 5,415,573 A | * | 5/1995 | Chen | ...................... | H01R 12/83 |
| | | | | | 439/876 |
| 5,820,393 A | * | 10/1998 | Edgley | ............... | H01R 12/7029 |
| | | | | | 439/381 |
| 6,729,771 B2 | * | 5/2004 | Kim | ..................... | G02B 6/4249 |
| | | | | | 385/76 |

(Continued)

FOREIGN PATENT DOCUMENTS

| DE | 102006040076 A1 | 3/2008 |
| DE | 102018101669 B3 | 3/2019 |

(Continued)

*Primary Examiner* — Agustin Bello
(74) *Attorney, Agent, or Firm* — LEYDIG, VOIT & MAYER, LTD.

(57) ABSTRACT

A connector for a circuit board includes a connector housing having a mounting arm. The mounting arm has a first fastening element that is releasably connectable to a first connecting element on the circuit board. The connection between the first fastening element and the first connecting element can be established and/or released by deflecting the mounting arm. A securing unit is disposed on the connector housing in such a way that the securing unit is movable between a releasing position and a locking position. In the locking position, the securing unit blocks deflection of the mounting arm. In the releasing position, the securing unit enables deflection of the mounting arm.

13 Claims, 3 Drawing Sheets

(56) References Cited

U.S. PATENT DOCUMENTS

| | | | | |
|---|---|---|---|---|
| 6,934,450 B2* | 8/2005 | Hiramatsu | | G02B 6/4292 385/139 |
| 6,962,192 B2* | 11/2005 | Lee | | H01L 23/4093 257/718 |
| 7,371,014 B2* | 5/2008 | Willis | | G02B 6/4204 385/24 |
| 7,399,125 B1* | 7/2008 | Whaley | | G02B 6/4204 385/88 |
| 7,441,965 B2* | 10/2008 | Furuno | | G02B 6/4292 385/32 |
| 8,482,923 B2* | 7/2013 | Tan | | H01L 23/4093 174/16.3 |
| 8,787,714 B2* | 7/2014 | Morioka | | G02B 6/4246 385/35 |
| 8,939,657 B2* | 1/2015 | Hung | | G02B 6/42 385/89 |
| 9,122,025 B2* | 9/2015 | Ishikawa | | G02B 6/4204 |
| 9,134,487 B2* | 9/2015 | Chang | | G02B 6/4204 |
| 9,354,110 B2* | 5/2016 | Lin | | G01J 1/0271 |
| 9,377,594 B2* | 6/2016 | Liff | | G02B 6/43 |
| 9,435,960 B2* | 9/2016 | Huang | | G02B 6/322 |
| 9,525,448 B2* | 12/2016 | Hsieh | | H05K 1/0274 |
| 9,645,334 B2* | 5/2017 | Ishii | | G02B 6/4269 |
| 9,857,546 B2* | 1/2018 | Zhang | | G02B 6/3882 |
| 9,983,367 B2* | 5/2018 | Zhang | | G02B 6/4269 |
| 10,151,891 B1* | 12/2018 | Lin | | G02B 6/3885 |
| 10,209,458 B2* | 2/2019 | Kurashima | | G02B 6/327 |
| 10,356,927 B2* | 7/2019 | Ehlen | | H05K 5/0282 |
| 10,459,179 B2* | 10/2019 | Lin | | G02B 6/4244 |
| 10,466,427 B2* | 11/2019 | Wang | | G02B 6/4292 |
| 10,976,506 B2* | 4/2021 | Matsui | | G02B 6/4249 |
| 2003/0082938 A1* | 5/2003 | Yamaguchi | | H01R 12/58 439/79 |
| 2006/0164738 A1* | 7/2006 | Yamamoto | | G02B 6/3829 359/871 |
| 2008/0232737 A1* | 9/2008 | Ishigami | | G02B 6/4284 385/88 |
| 2010/0020421 A1* | 1/2010 | Shimmo | | G02B 7/021 359/811 |
| 2011/0101255 A1* | 5/2011 | Tamura | | G02B 6/4246 250/551 |
| 2011/0164851 A1* | 7/2011 | Ishigami | | G02B 6/4292 385/93 |
| 2011/0293221 A1* | 12/2011 | Kaneshiro | | G02B 6/4201 385/88 |
| 2013/0022360 A1* | 1/2013 | Matsui | | G02B 6/4201 398/116 |
| 2013/0343698 A1* | 12/2013 | Ko | | G02B 6/4257 385/14 |
| 2014/0153881 A1* | 6/2014 | Liff | | G02B 6/4214 385/89 |
| 2014/0185995 A1* | 7/2014 | Lee | | G02B 6/4231 156/293 |
| 2015/0016786 A1* | 1/2015 | Chang | | G02B 6/4292 385/93 |
| 2015/0341066 A1* | 11/2015 | Hsieh | | G02B 6/4261 361/747 |
| 2015/0362685 A1* | 12/2015 | Shah | | G02B 6/4214 250/552 |
| 2016/0195684 A1* | 7/2016 | De Bruijn | | G02B 6/428 385/92 |
| 2016/0246019 A1* | 8/2016 | Ishii | | G02B 6/4246 |
| 2017/0010421 A1* | 1/2017 | Pitwon | | G02B 6/389 |
| 2017/0090125 A1* | 3/2017 | Kurashima | | G02B 6/4231 |
| 2017/0090131 A1* | 3/2017 | Zhang | | G02B 6/4292 |
| 2017/0219786 A1* | 8/2017 | Morioka | | G02B 6/4292 |
| 2018/0180830 A1* | 6/2018 | Kawamura | | G02B 6/4214 |
| 2018/0267263 A1* | 9/2018 | Wang | | G02B 6/4214 |
| 2018/0284359 A1* | 10/2018 | Akieda | | G02B 6/3888 |
| 2018/0372956 A1* | 12/2018 | Chen | | G02B 6/421 |
| 2019/0097735 A1* | 3/2019 | Akieda | | G02B 6/4266 |
| 2019/0187392 A1* | 6/2019 | Wang | | G02B 6/3893 |
| 2020/0241214 A1 | 7/2020 | Nguyen et al. | | |
| 2020/0333539 A1* | 10/2020 | Matsui | | G02B 6/4249 |
| 2021/0151361 A1* | 5/2021 | Schlack | | G01R 1/0458 |
| 2022/0365288 A1* | 11/2022 | Wong | | G02F 1/133607 |
| 2023/0118676 A1* | 4/2023 | Pritz | | H01R 12/7023 385/92 |
| 2023/0120026 A1* | 4/2023 | Pritz | | G02B 6/4246 385/92 |

FOREIGN PATENT DOCUMENTS

| | | |
|---|---|---|
| DE | 102018206480 A1 | 10/2019 |
| DE | 102018126145 A1 | 4/2020 |
| EP | 3306755 B1 | 4/2018 |
| WO | WO 0223235 A2 | 3/2002 |

* cited by examiner

CIRCUIT BOARD CONNECTOR FOR A CIRCUIT BOARD

CROSS REFERENCE TO RELATED APPLICATION

This application claims benefit to German Patent Application No. DE 10 2021 127 032.4, filed on Oct. 19, 2021, which is hereby incorporated by reference herein.

FIELD

The invention relates to a connector for a circuit board that is releasably attachable to a circuit board. The connector is in particular suitable for connecting the circuit board to an optical waveguide.

BACKGROUND

Due to the increasing digitization and miniaturization of products and processes and the resulting ever-increasing amounts of data, there is also an ever-increasing demand for space-saving and cost-effective data connections that enable high data transfer rates. Since optical waveguides are particularly suitable for transmission of high data rates, the use of optical waveguides as data transmission means is becoming increasingly more interesting. The connection of optical waveguides is mostly effected via connector systems, so that the optical waveguide can be releasably connected either to another optical waveguide or to a semiconductor circuit board. Connection to the semiconductor circuit board is typically accomplished using circuit board connectors which are permanently connected to the semiconductor circuit board, for example, by soldering. The permanent connection of the semiconductor circuit board permits easy assembly as well as accurate and rugged mounting of the circuit board connector on the semiconductor circuit board, thereby ensuring that light can be transmitted through the circuit board connector.

SUMMARY

In an embodiment, the present invention provides a connector for a circuit board. The connector includes a connector housing having at least one mounting arm. The at least one mounting arm has at least one first fastening element that is releasably connectable to a first connecting element on the circuit board. The connection between the at least one first fastening element and the first connecting element can be established and/or released by deflecting the at least one mounting arm. A securing unit is disposed on the connector housing in such a way that the securing unit is movable between a releasing position and a locking position. In the locking position, the securing unit blocks deflection of the at least one mounting arm. In the releasing position, the securing unit enables deflection of the at least one mounting arm.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
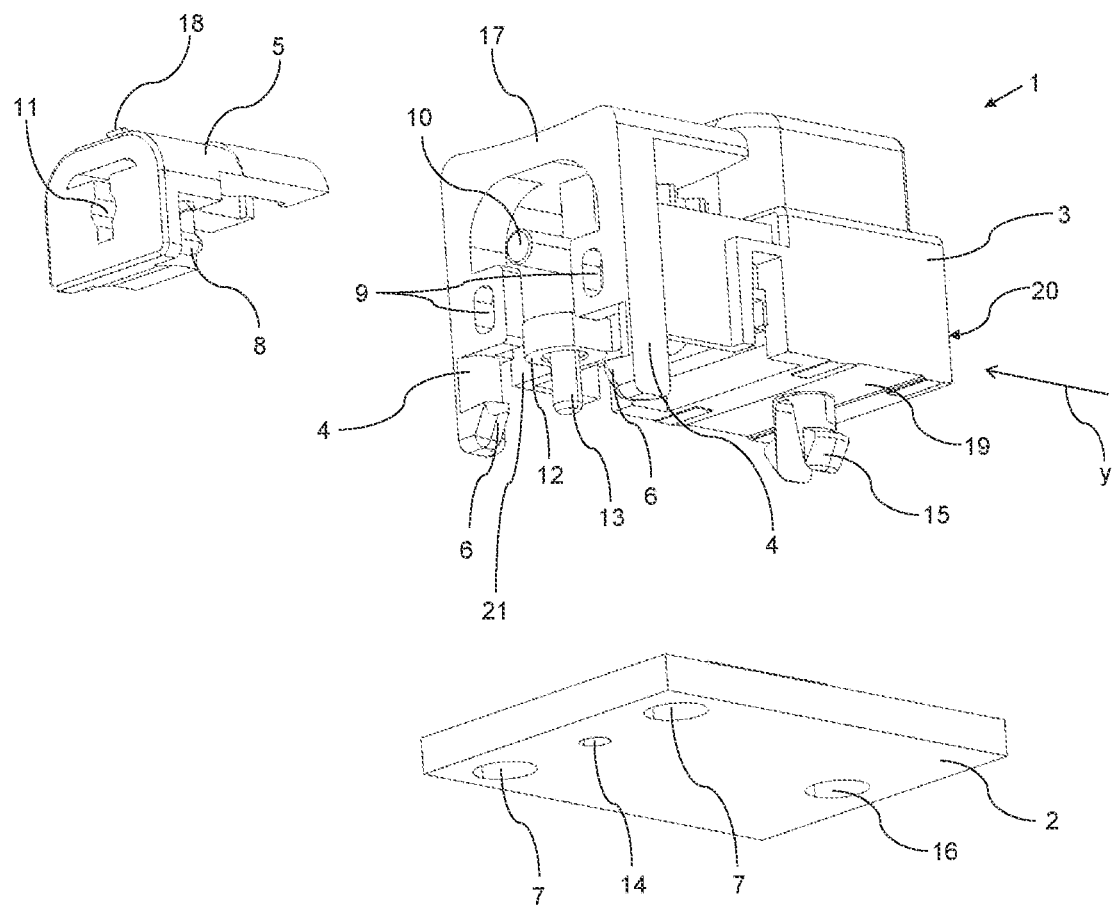
FIG. 1 is a three-dimensional exploded view of a first embodiment of a connector according to the invention.

As raw materials are becoming increasingly scarce, and because of an ever-increasing demand for more sustainable products, permanent attachment of the circuit board connector is associated with several disadvantages. For example, permanent attachment makes recycling of both the semiconductor circuit board and the circuit board connector significantly more difficult because the components cannot be completely separated from one another. However, releasable attachments of the circuit board connector to the semiconductor circuit board have the drawback that the circuit board connector may inadvertently become detached from the semiconductor circuit board. Furthermore, manufacturing tolerances of the semiconductor circuit board or of the circuit board connector may result in the circuit board connector having some play relative to the semiconductor circuit board, which significantly degrades the light-conducting connection to be established by the circuit board connector.

In an embodiment, the present invention provides a connector for circuit boards which is releasably connectable to the circuit board and overcomes at least one of the disadvantages of the above-mentioned prior art.

An inventive connector according to an embodiment of the present invention for a circuit board has a connector housing. The connector housing has at least one mounting arm. The connector further has a securing unit. The mounting arm has at least one first fastening element that is releasably connectable to a first connecting element on the circuit board. The first fastening element is preferably disposed on a free end of the mounting arm. The first fastening element may be, for example, a latch hook. The first connecting element may be, for example, a latch receptacle or a latch opening. However, it is also possible that the first fastening element may be configured as a latch opening and that the first connecting element may be configured as a latch hook. The securing unit is disposed on the connector housing in such a way that it is movable between a releasing position and a locking position. The connection between the first fastening element and the first connecting element can be established and/or released by deflecting the mounting arm. The securing unit blocks deflection of the mounting arm in the locking position. Consequently, the connection between the first fastening element and the first connecting element cannot be established and/or released when the securing unit is in the locking position. The securing unit enables deflection of the mounting arm in the releasing position. Consequently, the connection between the first fastening element and the first connecting element can be established and/or released when the securing unit is in the releasing position.

The connector according to embodiments of the invention enables a releasable yet reliable connection to be established between the connector and a circuit board in a simple manner with few components. Because of the securing unit, which is movable between the locking position and the releasing position, the connector can at any time be released from the circuit board if the connector is to removed from the circuit board. In addition, since the connector can be both attached to and removed from the circuit board in a reversible non-destructive manner, it is additionally possible for individual components of the connector to be configured to be replaceable since, due to the releasable connection of the connector to the circuit board, these components can be accessed more easily. While the inventive connector is particularly suitable for connecting the circuit board to an optical waveguide, the connector can also be used for electrical data lines, such as radio-frequency or high frequency lines, to be connected to the circuit board.

The securing unit may have at least one locking element which, in the locking position, is connected to a receiving element on the mounting arm. The locking element may be configured, for example, as a locking pin, and the receiving element may be configured, for example, as a receiving opening, in particular in the form of an elongated slot. In the locking position, the locking pin is preferably located within the receiving opening. In the releasing position, the locking pin is preferably located outside the receiving opening. The locking pin and the receiving opening preferably extend perpendicular to a deflection direction in which the mounting arm is deflectable.

The securing unit may be movable between the releasing position and the locking position in a direction of movement parallel to a mating axis. In this context, the mating axis can be understood to be an imaginary directional axis along which the connector has to be moved relative to a mating connector to allow the connector to be connected to the mating connector. Moreover, it may be advantageous if the direction of movement along which the securing unit is movable between the releasing position and the locking position is parallel to a largest side of the circuit board.

The connector housing may have a guide element extending away from the connector housing in a direction parallel to the mating axis. The guide element may take the form of, for example, a guide pin. The securing unit may have a guide opening, the guide element preferably being disposed at least partially within the guide opening. Preferably, the guide element is disposed within the guide opening in both the releasing position and the locking position. By means of the guide element disposed within the guide opening, it is possible to ensure that the movement of the securing unit between the releasing position and the locking position takes place in a guided manner, thereby making it possible, for example, to prevent the securing unit from getting wedged.

The connector housing may have at least one positioning element that is insertable into a positioning opening in the circuit board. The positioning element may take the form of, for example, a positioning pin. The positioning opening preferably has a shape that is complementary to an outer contour of the positioning element so that the connector has minimal play when the positioning element is located in the positioning opening. It is especially advantageous if the positioning element and the locking element are disposed parallel to each other.

The connector housing may have least one abutment element. The circuit board may be clampable between the first fastening element and the abutment element. The abutment element may take the form of, for example, an abutment surface. By clamping the circuit board between the first fastening element and the abutment element, the connector is stationarily positioned on the circuit board. If the connector housing has a positioning element, it is especially advantageous if the positioning element is disposed on the abutment element.

The connector housing may have a second fastening element that is connectable to a second connecting element on the circuit board. In a mounted state, the fastening element is preferably disposed on a bottom side of the connector housing facing the circuit board. The second fastening element may be disposed in alignment with the positioning element, the alignment line preferably being parallel to the mating axis. The second fastening element can be connected to the second connecting element in such a manner that the bottom side of the connector housing is biased against the circuit board. This may be achieved, for example, by the second fastening element being configured as a resilient latch hook and the second connecting element being configured as a latch opening.

The connector housing may have two mounting arms, each having a first fastening element. Preferably, each mounting arm has a first fastening element that is connectable to a respective first connecting element of the circuit board. The mounting arms are preferably deflectable in opposite directions to establish and/or release the connection between the first fastening elements and the first connecting elements. Particularly preferably, the mounting arms can be moved toward each other or away from each other. The two mounting arms are preferably disposed in a plane perpendicular to the mating axis. If the connector housing has a second fastening element, the mounting arms preferably form an equilateral triangle with the second connecting element, the sides of the triangle each being formed between a mounting arm and the second fastening element.

The circuit board may be clampable between the mounting arms. This may be achieved, for example, by the mounting arms being biased against each other when the first fastening elements are connected to the first connecting elements. For example, the first fastening elements may be configured as latch hooks and the first connecting elements as latch openings. The first connecting elements may be spaced apart by a distance that is different from, in particular greater than, the distance by which the first fastening elements are spaced apart. When the first fastening elements are connected to the first connecting elements, the two fastening arms cannot be returned to their rest position because of the different spacing, so that the two mounting arms exert a force on the circuit board that causes clamping of the circuit board. To additionally enhance the clamping of the circuit board between the mounting arms, the abutment element may be at least partially disposed between the mounting arms. In this way, the bias of the mounting arms can be additionally used to additionally clamp the circuit board against the abutment element.

The mounting arms may be interconnected by a connecting portion. Preferably, the mounting arms are connected to the connecting portion at ends opposite the free ends. The connecting portion makes it possible, in particular, to uniformly bias the two mounting arms against the circuit board.

Furthermore, the connecting portion may be made flexible so that the mounting arms can be moved apart by pressing on the connecting portion.

The securing unit may have a projecting element which, in the locking position, exerts a pressure force on the connecting portion, which pressure force biases the mounting arms against each other. The projecting element preferably extends away from the securing unit and may be configured, for example, as a wedge. The projecting element may, for example, elastically deform the connecting portion, the tension resulting from the elastic deformation biasing the mounting arms against each other.

The mounting arms may be disposed at a rear side of the connector housing opposite a mating side of the connector housing. In this way, not only can the connector be securely connected to the circuit board in stationary relationship therewith, but also the securing unit is easily accessible.

FIG. 1 shows a three-dimensional exploded view of a first embodiment of the connector 1 according to the invention. Connector 1 can be releasably attached to a circuit board 2 and is essentially used for connecting circuit board 2 to a mating connector. Connector 1 has a connector housing 3 and a securing unit 5. Connector housing 3 has two mounting arms 4, each having a first fastening element 6. Mounting arms 4 are disposed at a rear side 21 of connector housing 3 opposite the mating side 20. Furthermore, mounting arms 4 are interconnected at one end via a connecting portion 17. In the present embodiment, first fastening elements 6 are configured as latch hooks. First fastening elements 6 are connectable to first connecting elements 7 on circuit board 2. In the present embodiment, first connecting elements 7 are configured as latch openings. For purposes of connection to the latch openings, the latch hooks are passed through the latch openings and snapped to circuit board 2 at the edges of the latch openings. In order to connect first fastening elements 6 to first connecting elements 7, mounting arms 4 are deflected. In the present embodiment, the two mounting arms 4 are deflected away from each other perpendicular to a mating axis y. At a bottom side 19, connector housing 3 has a second fastening element 15 formed by a double-legged latch hook. The latch hooks are configured such that connector housing 3 is biased with its bottom side 19 against circuit board 2 when second fastening element 15 is connected to second connecting element 16. Second fastening element 15 is releasably connectable to a second connecting element 16 in circuit board 2. The second connecting element is also configured as a latch opening. The first fastening elements 6 on mounting arms 4 and second fastening element 15 are arranged in the form of an equilateral triangle. At bottom side 19, connector housing 3 has a positioning element 13 that can be placed in a positioning opening 14 in circuit board 2. The positioning element is disposed in alignment with second fastening element 15, the alignment line being parallel to mating axis y. Positioning element 13 is disposed on an abutment element 12 of connector housing 3.

Securing unit 5 can be disposed on connector housing 3 in such a way that it is movable between a releasing position and a locking position. To enable unhindered movement between the releasing position and the locking position, connector housing 3 has a guide element 10 partially disposed in a guide opening 11 on securing unit 5. Guide element 10 extends away from rear side 21 of connector housing 3 in a direction parallel to mating axis y. In the present embodiment, securing unit 5 has two locking elements 8 in the form of locking pins, which, in the locking position, are connected to receiving elements 9 on mounting arms 4. In the present embodiment, receiving elements 9 are configured as receiving openings. In the locking position, the locking pins are located within the receiving openings. In the releasing position, the locking pins are located outside the receiving openings.

Figure 2:
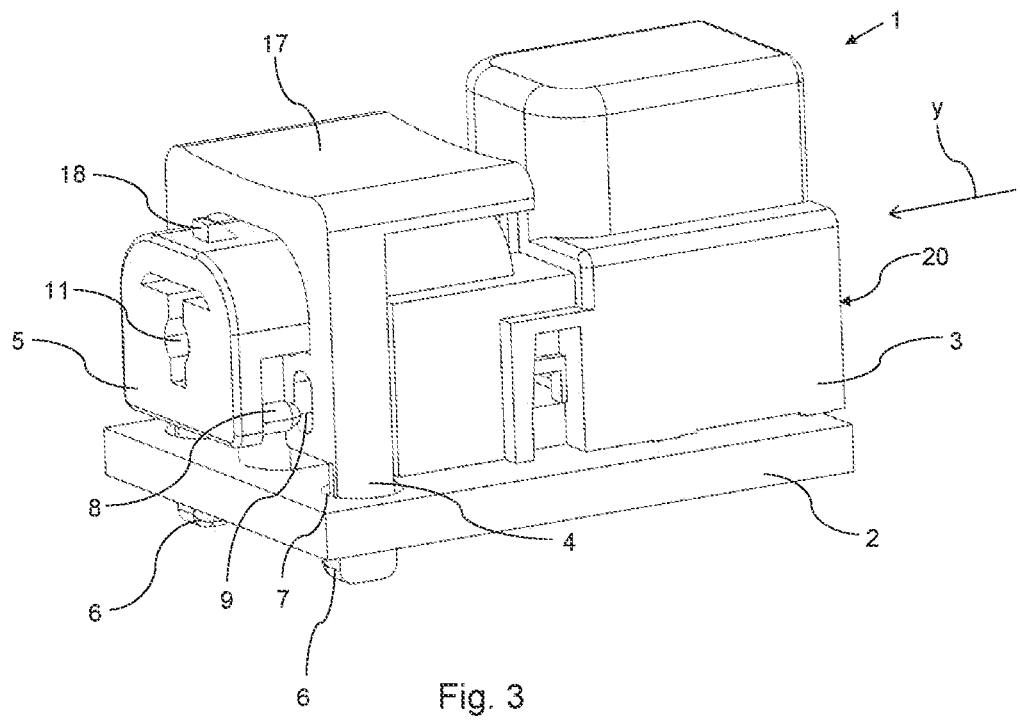
FIG. 2 is a three-dimensional view of the first embodiment of the connector according to the invention, with a securing unit in a releasing position.

FIG. 2 shows the first embodiment of the inventive connector 1 in a three-dimensional view, with securing unit 5 in the releasing position. Locking elements 8 are aligned with receiving elements 9. However, locking elements 8 are located outside the receiving elements 9, so that mounting arms 4 can be deflected in the releasing position. In the view shown, connector 1 is releasably connected via first fastening elements 6 and the second fastening element to first connecting elements 7 and to the second connecting element of circuit board 2. However, the releasable connection of first fastening elements 6 to first connecting elements 7 could be easily released by deflecting mounting arms 4 once again.

Figure 3:
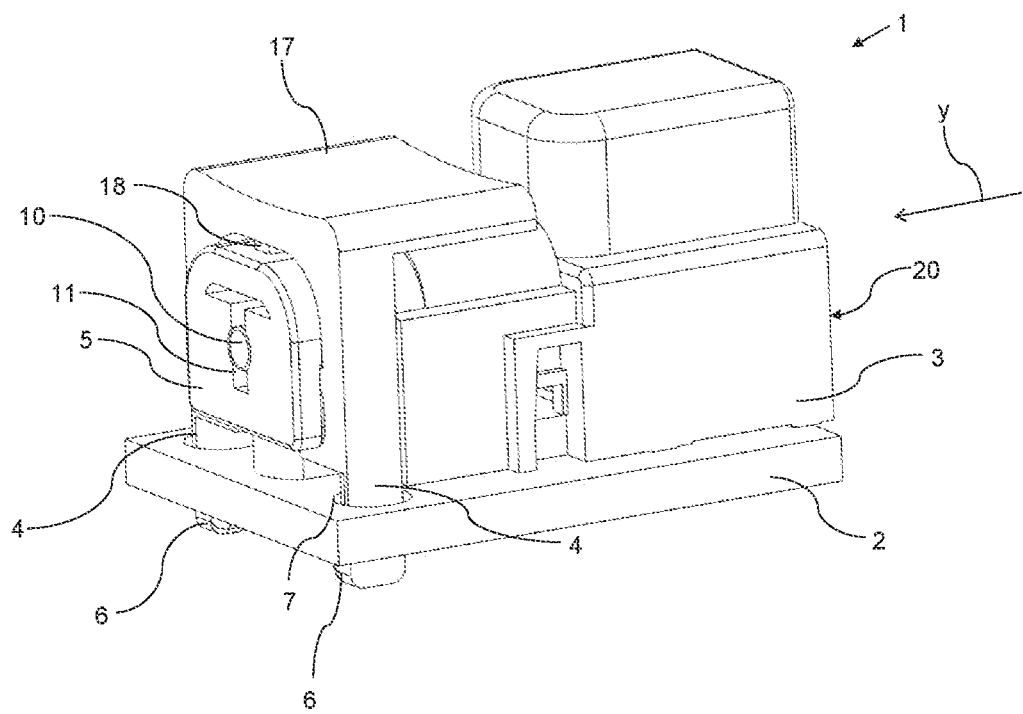
FIG. 3 is a three-dimensional view of the first embodiment of the connector according to the invention, with the securing unit in a locking position.

FIG. 3 shows the first embodiment of the inventive connector 1 in a three-dimensional view, with securing unit 5 in the locking position. Locking elements 8 are connected to receiving elements 9. Thus, securing unit 5 blocks deflection of mounting arms 4 in the locking position. Securing unit 5 has a projecting element 18 which, in the present embodiment, is configured as a wedge. Projecting element 18 projects from securing unit 5 toward connecting portion 17. In the locking position, projecting element 18 is pressed against connecting portion 17, thereby causing connecting portion 17 to elastically deform. The elastic deformation and the resulting mechanical tension bias the two mounting arms 4 against each other. As a result, circuit board 2 is clamped between mounting arms 4, enabling connector 1 to be fixed in a stationary position on circuit board 2. Moreover, such clamping presses connector 1 against circuit board 2.

Figure 4:
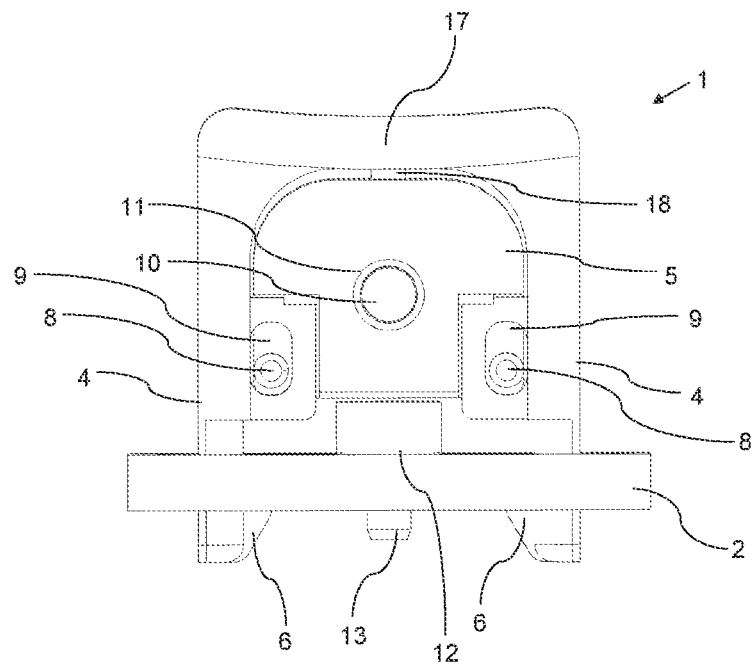
FIG. 4 is a sectional view of the first embodiment of the connector according to the invention.

FIG. 4 shows a sectional view of the first embodiment of the connector 1 according to the invention, the sectional plane extending perpendicular to the mating axis and through both mounting arms 4. Securing unit 5 is in the locking position, so that locking elements 8 are connected to the receiving elements, thereby blocking deflection of mounting arms 4. By the securing unit 5 being guided on guide element 10 via guide opening 11, securing unit 5 can be additionally stabilized, thereby ensuring that locking elements 8 will not be released from receiving elements 9, even in the event of larger forces acting on mounting arms 4 or securing unit 5. Due to the tension produced by projecting element 18 in connecting portion 17, circuit board 2 is not only clamped between mounting arms 4, but also pressed against abutment element 12.

Figure 5A:
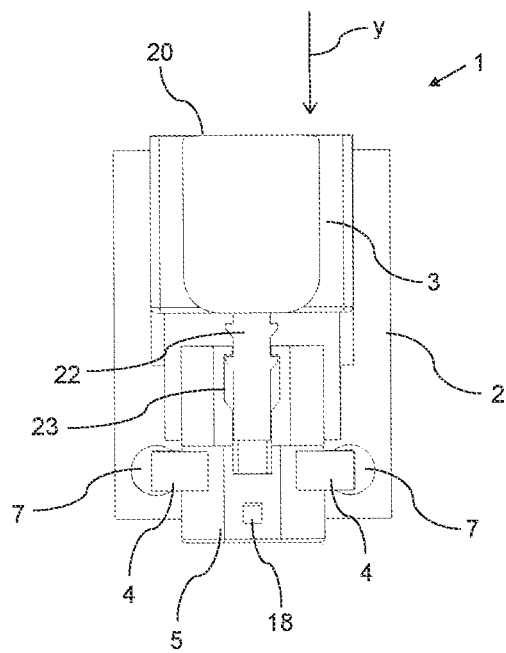
FIG. 5a is a plan view of the first embodiment of the connector according to the invention, with the securing unit in the releasing position.
Figure 5B:
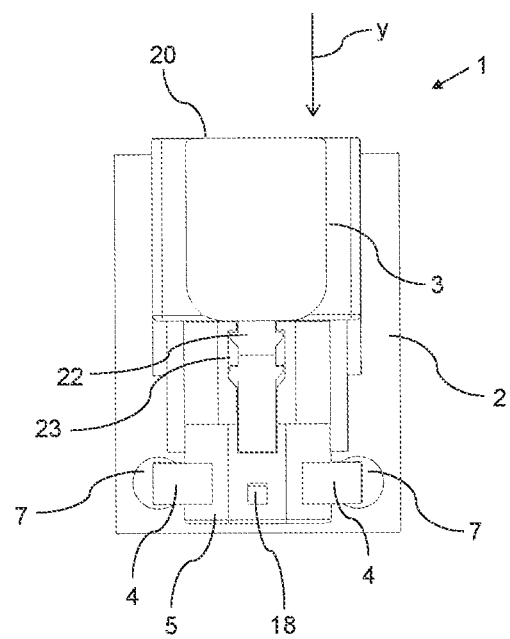
FIG. 5b is a plan view of the first embodiment of the connector according to the invention, with the securing unit in the locking position.

FIGS. 5A and 5b show views of the first embodiment of the connector 1 according to the invention. Bottom side 19 faces the viewer. The connecting portion has been removed for improved clarity. In FIG. 5a, securing unit 5 is in the releasing position, while in FIG. 5b, securing unit 5 is in the locking position. The connector housing has a retaining segment 22 having a plurality of retaining elements. Retaining segment 22 is disposed in a cutout 23 in securing unit 5, the releasing position and the locking position of securing unit 5 being defined by the arrangement of the retaining elements on retaining segment 22.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE NUMERALS 1 connector
2 circuit board
3 connector housing
4 mounting arm
5 securing unit
6 first fastening element
7 first connecting element
8 locking element
9 receiving element
10 guide element
11 guide opening
12 abutment element
13 positioning element
14 positioning opening
15 second fastening element
16 second connecting element
17 connecting portion
18 projecting element
19 bottom side
20 mating side
21 rear side
22 retaining segment
23 cutout

What is claimed is:

1. A connector for a circuit board, the connector comprising:
a connector housing having at least one mounting arm, the at least one mounting arm having at least one first fastening element that is releasably connectable to a first connecting element on the circuit board, wherein the connection between the at least one first fastening element and the first connecting element can be established and/or released by deflecting the at least one mounting arm; and
a securing unit disposed on the connector housing in such a way that the securing unit is movable between a releasing position and a locking position, wherein, in the locking position, the securing unit blocks deflection of the at least one mounting arm, and wherein, in the releasing position, the securing unit enables deflection of the at least one mounting arm.

2. The connector as recited in claim 1, wherein the securing unit has at least one locking element which, in the locking position, is connected to a receiving element on the at least one mounting arm.

3. The connector as recited in claim 1, wherein the securing unit is movable between the releasing position and the locking position in a direction of movement parallel to a mating axis.

4. The connector as recited in claim 3, wherein the connector housing has a guide element that extends away from the connector housing in a direction parallel to the mating axis and is partially disposed within a guide opening in the securing unit.

5. The connector as recited in claim 1, wherein the connector housing has at least one positioning element that is insertable into a positioning opening in the circuit board.

6. The connector as recited in claim 1, wherein the connector housing has least one abutment element, and the circuit board is clampable between the at least one first fastening element and the abutment element.

7. The connector as recited in claim 1, wherein the connector housing has a second fastening element that is connectable to a second connecting element on the circuit board.

8. The connector as recited in claim 1, wherein the connector housing has two mounting arms, each having a first fastening element, each of which is connectable to a first connecting element of the circuit board, the mounting arms being deflectable in opposite directions to establish and/or release the connection.

9. The connector as recited in claim 8, wherein the circuit board is clampable between the mounting arms.

10. The connector as recited in claim 8, wherein the mounting arms are interconnected by a connecting portion.

11. The connector as recited in claim 10, wherein the securing unit has a projecting element which, in the locking position, exerts a pressure force on the connecting portion, wherein the pressure force biases the mounting arms against each other.

12. The connector as recited in claim 8, wherein the two mounting arms are configured to be elastically deformed to establish and/or release the connection such that a resulting mechanical tension biases the two mounting arms toward each other and clamps the circuit board between the two mounting arms.

13. The connector as recited in claim 1, wherein the connection can be established and/or released by elastic deformation of the at least one mounting arm.

\* \* \* \* \*